US011081675B2

(12) United States Patent
Teramoto et al.

(10) Patent No.: US 11,081,675 B2
(45) Date of Patent: Aug. 3, 2021

(54) DISPLAY UNIT AND ELECTRONIC APPARATUS

(71) Applicant: JOLED INC., Tokyo (JP)

(72) Inventors: Kazuma Teramoto, Tokyo (JP);
Kenichi Nendai, Tokyo (JP); Jiro Yamada, Tokyo (JP); Hideki Kobayashi, Tokyo (JP)

(73) Assignee: JOLED INC., Tokyo (JP)

( * ) Notice: Subject to any disclaimer, the term of this patent is extended or adjusted under 35 U.S.C. 154(b) by 37 days.

(21) Appl. No.: 16/306,898

(22) PCT Filed: Apr. 20, 2017

(86) PCT No.: PCT/JP2017/015900
§ 371 (c)(1),
(2) Date: Dec. 4, 2018

(87) PCT Pub. No.: WO2017/217113
PCT Pub. Date: Dec. 21, 2017

(65) Prior Publication Data
US 2019/0214602 A1    Jul. 11, 2019

(30) Foreign Application Priority Data

Jun. 15, 2016    (JP) .............................. JP2016-118837

(51) Int. Cl.
*H01L 27/32*    (2006.01)
*H01L 51/52*    (2006.01)
*G09F 9/30*    (2006.01)

(52) U.S. Cl.
CPC ............ *H01L 51/5271* (2013.01); *G09F 9/30* (2013.01); *H01L 27/3246* (2013.01);
(Continued)

(58) Field of Classification Search
CPC ............ H01L 51/5271; H01L 27/3246; H01L 27/3211; H01L 51/50; H01L 27/32
See application file for complete search history.

(56) References Cited

U.S. PATENT DOCUMENTS

| 2005/0017631 A1 | 1/2005 | Liedenbaum et al. |
| 2006/0054894 A1 | 3/2006 | Miyake et al. |

(Continued)

FOREIGN PATENT DOCUMENTS

| CN | 102130146 A | 7/2011 |
| CN | 103840090 A | 6/2014 |

(Continued)

OTHER PUBLICATIONS

Office Action in JP Application No. 2018-523547, dated Apr. 16, 2019, 8pp.

(Continued)

*Primary Examiner* — Michele Fan
(74) *Attorney, Agent, or Firm* — Hauptman Ham, LLP

(57) ABSTRACT

A display unit includes a plurality of pixels and a first insulating film. The plurality of pixels are arranged in matrix in a first direction and a second direction. The first insulating film is provided between adjacent pixels of the pixels, and has first openings in light-emitting regions of the respective pixels. The first insulating film has, between pixels adjacent in the second direction of the pixels, a second opening extending in the first direction, and a remaining part inside the second opening.

9 Claims, 10 Drawing Sheets

(52) U.S. Cl.
CPC ......... *H01L 27/322* (2013.01); *H01L 27/3211* (2013.01); *H01L 51/5284* (2013.01); *H01L 2251/5315* (2013.01)

(56) References Cited

U.S. PATENT DOCUMENTS

| | | | |
|---|---|---|---|
| 2010/0045173 A1* | 2/2010 | Kwon | H01L 27/3244 313/504 |
| 2010/0213827 A1* | 8/2010 | Yoshida | H01L 27/3246 313/504 |
| 2011/0101888 A1 | 5/2011 | Uchida | |
| 2012/0217518 A1* | 8/2012 | Abe | H01L 51/5209 257/88 |
| 2013/0214301 A1 | 8/2013 | Yamada et al. | |
| 2014/0147950 A1 | 5/2014 | Choi et al. | |
| 2014/0175469 A1* | 6/2014 | Dozen | H01L 27/3246 257/89 |
| 2014/0312329 A1 | 10/2014 | Fujii et al. | |
| 2014/0346459 A1 | 11/2014 | Song et al. | |
| 2015/0137107 A1 | 5/2015 | Sagawa | |
| 2015/0144906 A1 | 5/2015 | Ichikawa | |
| 2016/0315125 A1 | 10/2016 | Kikuchi et al. | |
| 2017/0069694 A1 | 3/2017 | Ajiki et al. | |
| 2017/0141169 A1* | 5/2017 | Sim | H01L 27/3258 |

FOREIGN PATENT DOCUMENTS

| | | |
|---|---|---|
| JP | 2005-512298 A | 4/2005 |
| JP | 2008-91070 A | 4/2008 |
| JP | 2010-176937 A | 8/2010 |
| JP | 2012-43583 A | 3/2012 |
| JP | 2013-191533 A | 9/2013 |
| JP | 2013-235281 A | 11/2013 |
| JP | 2014-170761 A | 9/2014 |
| JP | 2014-212070 A | 11/2014 |
| JP | 2015-103438 A | 6/2015 |
| JP | 2015-144087 A | 8/2015 |
| JP | 2016-15292 A | 1/2016 |
| TW | 201318240 A1 | 5/2013 |
| WO | 2013/038971 A1 | 3/2013 |
| WO | 2015/136579 A1 | 9/2015 |

OTHER PUBLICATIONS

International Search Report in PCT/JP2017/015900, dated Jul. 11, 2017. 4pp.

* cited by examiner

[Fig.1]
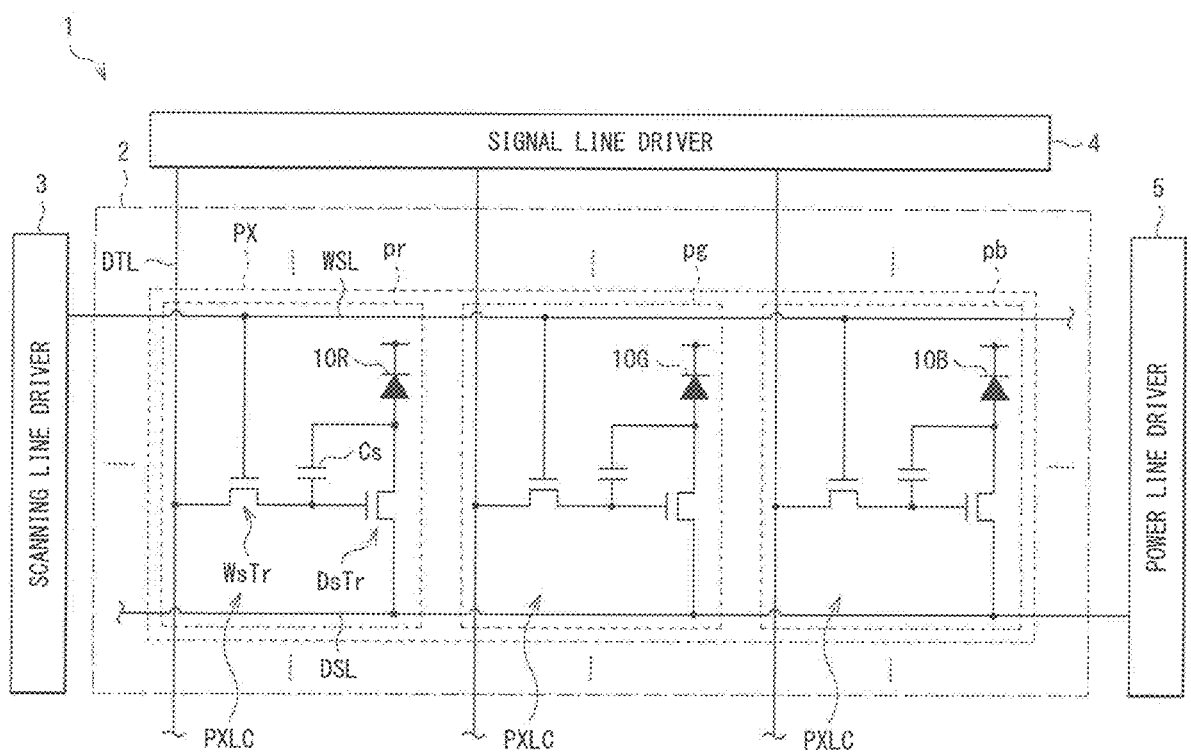

[FIG. 2]
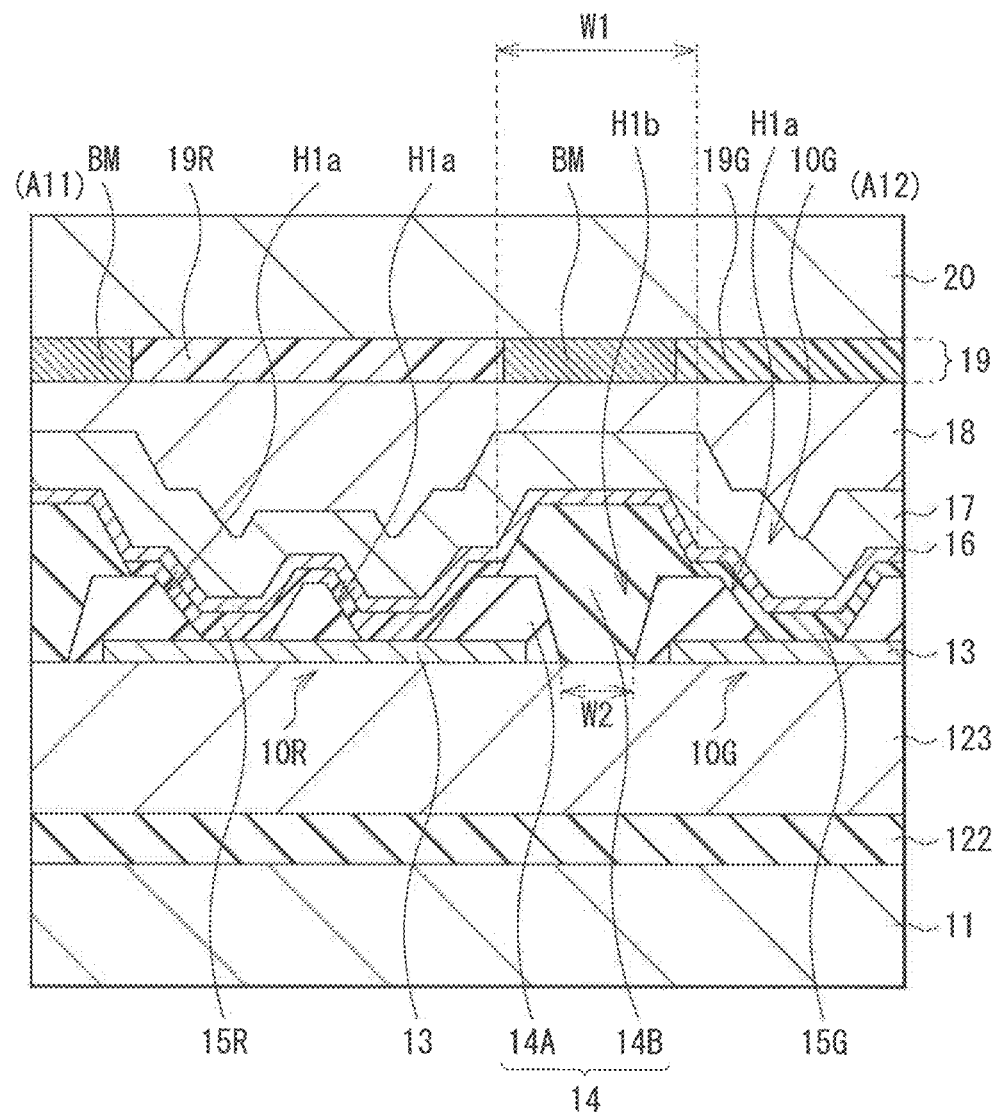

[FIG. 3]
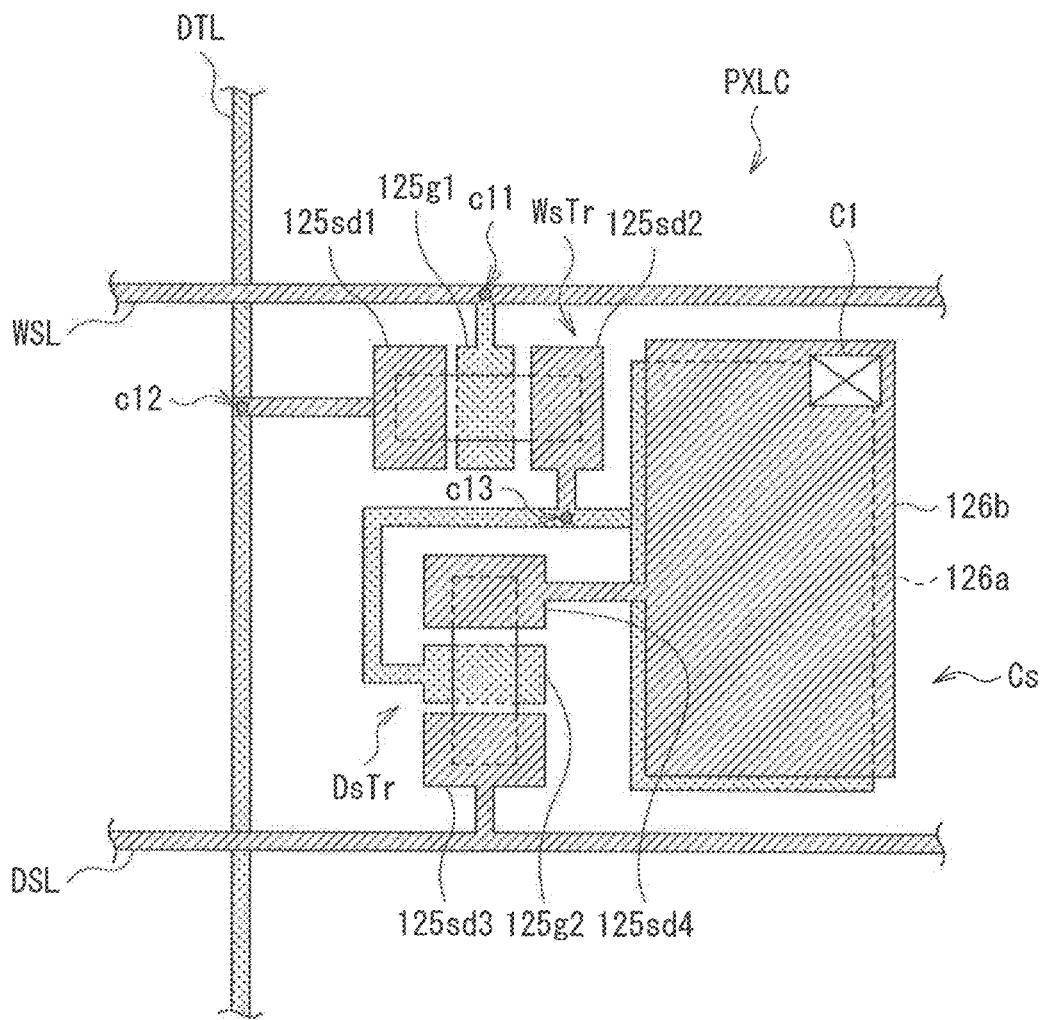

[FIG. 4]
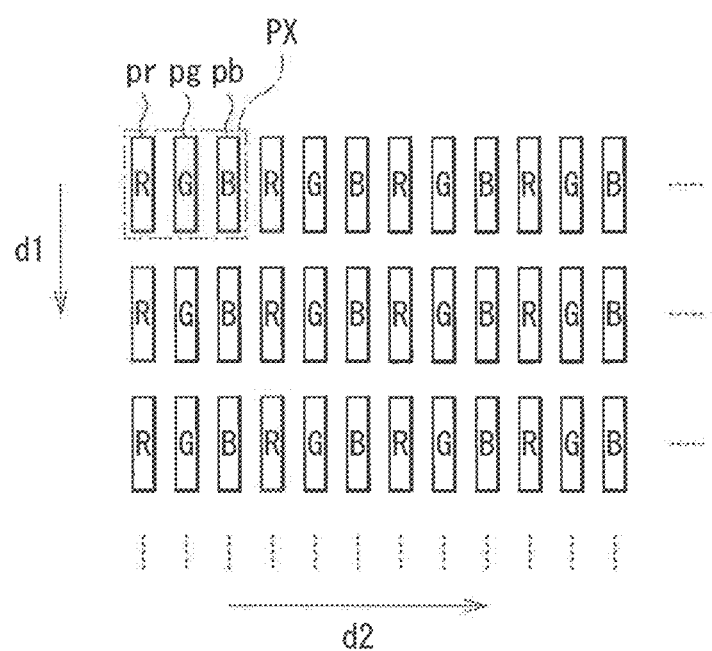

[FIG. 5A]
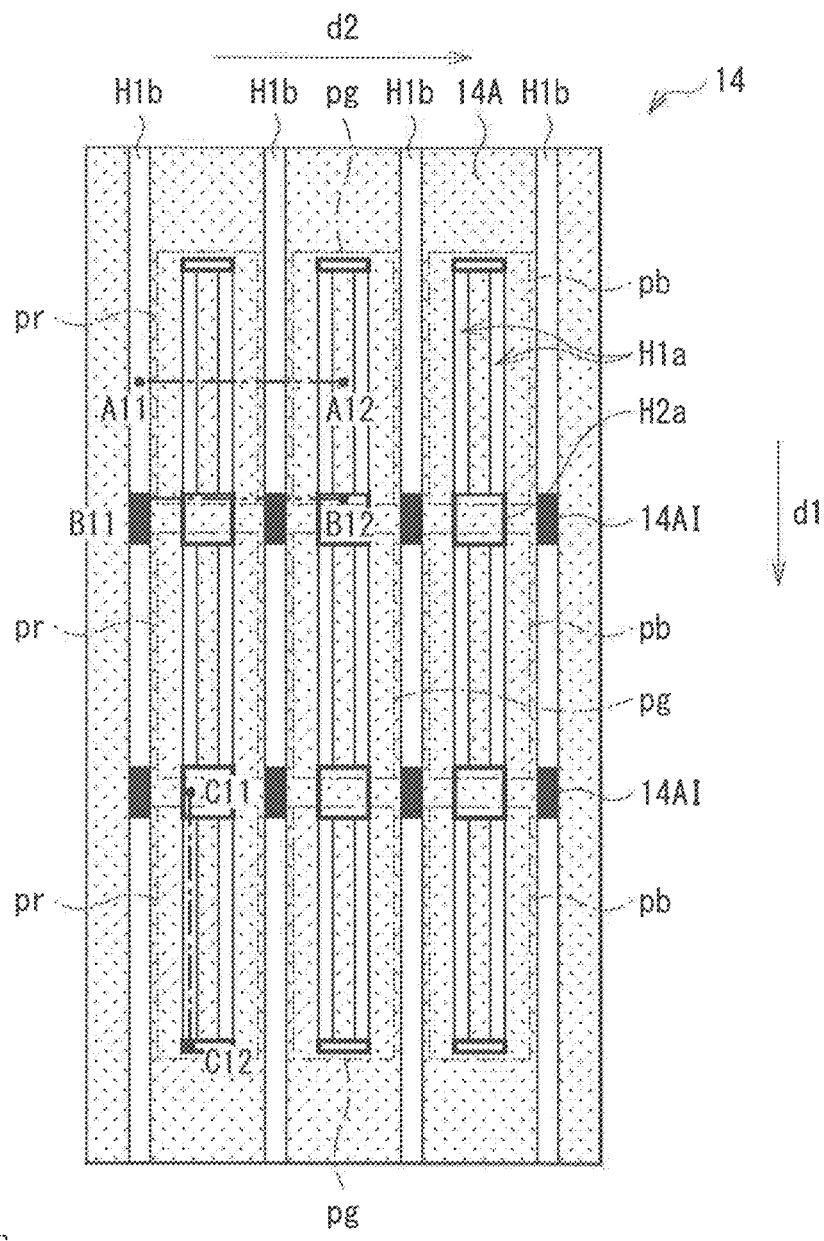
[FIG. 5B]
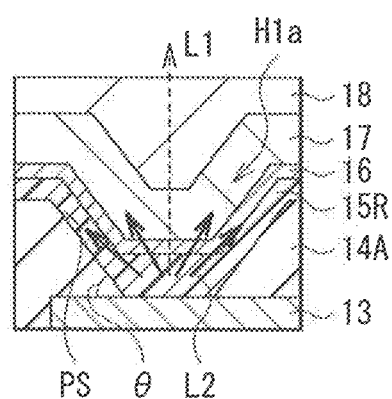

[ FIG. 6A ]
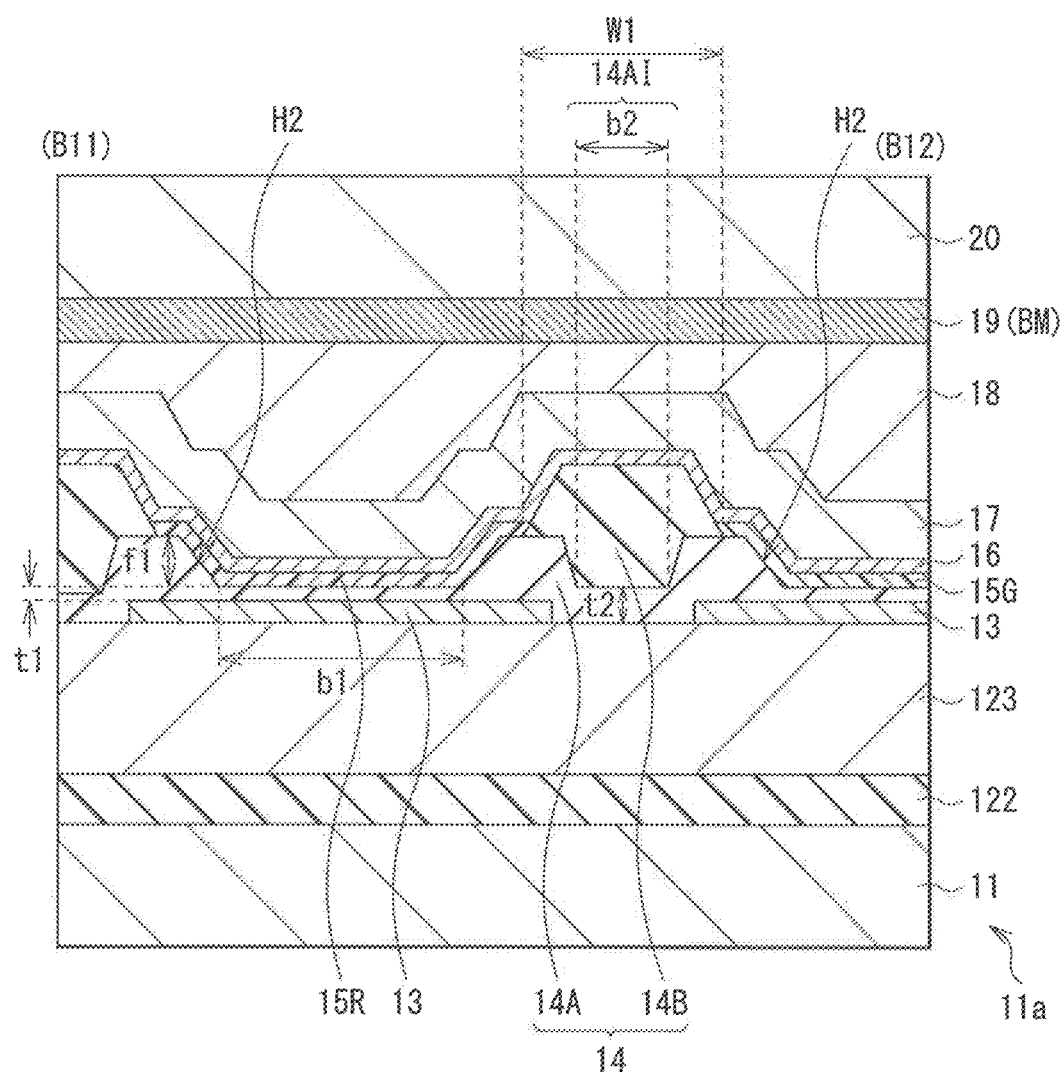

[ FIG. 6B ]
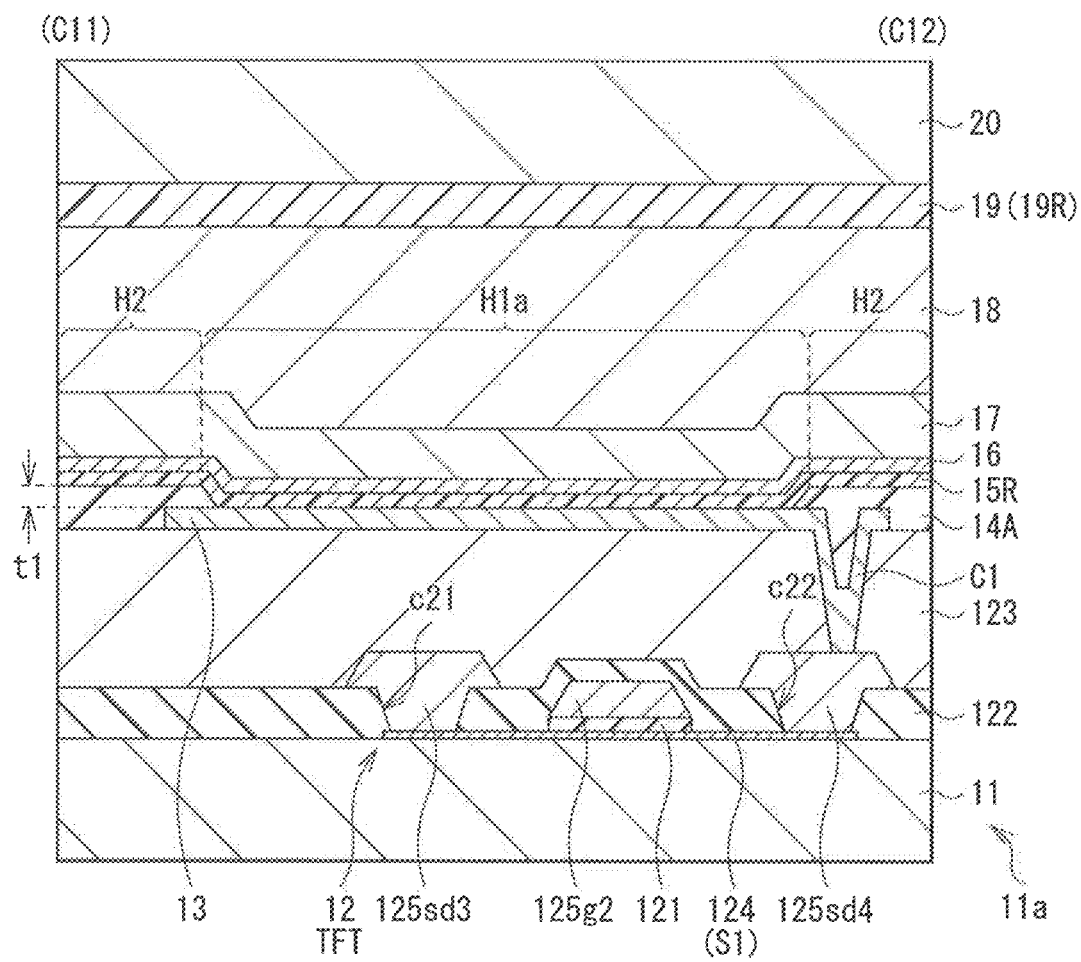
[ FIG. 7A ]
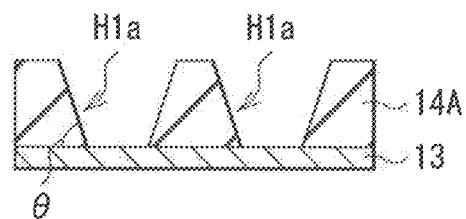
[ FIG. 7B ]
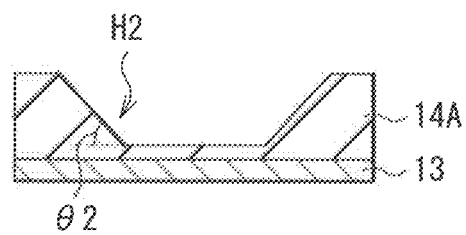

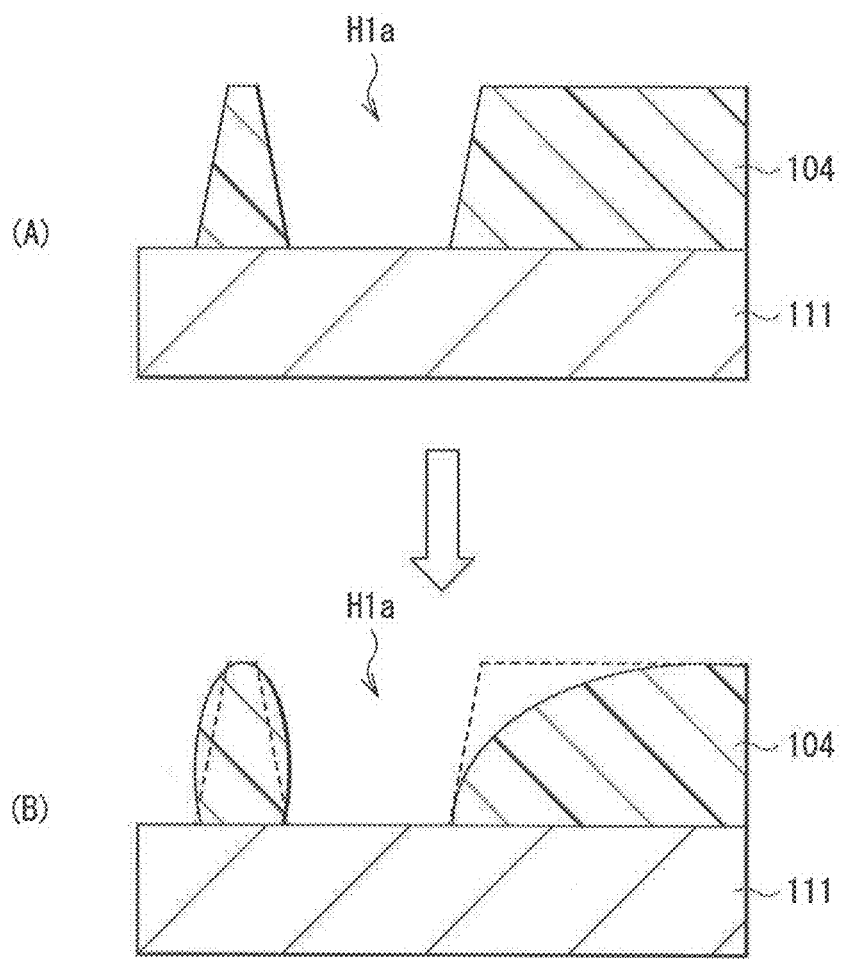
[FIG. 8]

[FIG. 9]
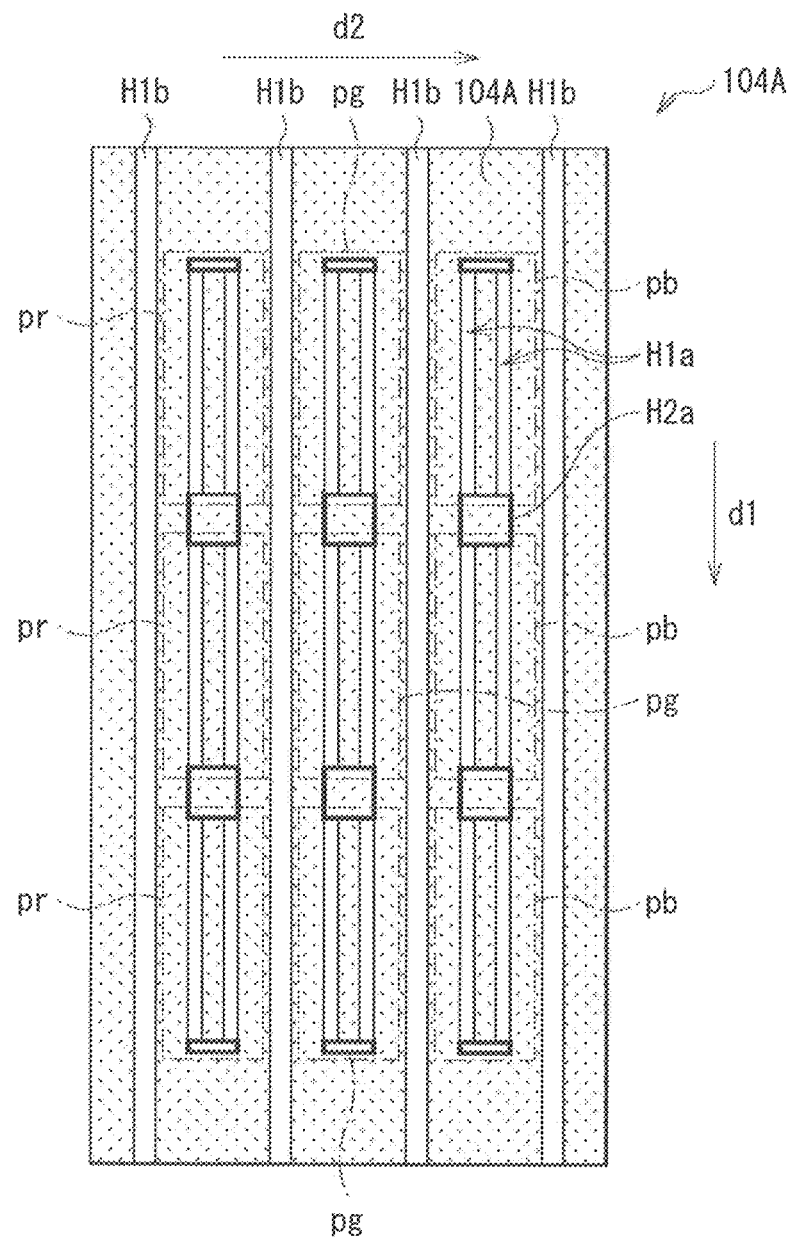

[ FIG. 10 ]
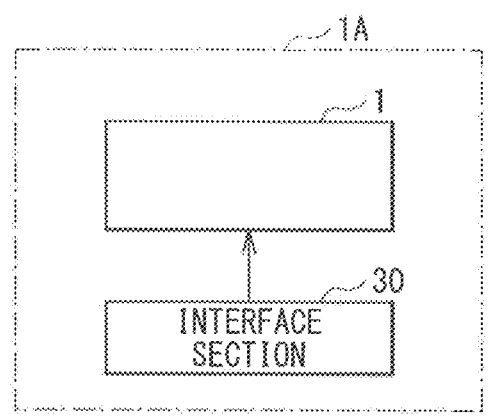

DISPLAY UNIT AND ELECTRONIC APPARATUS

RELATED APPLICATIONS

The present application is a National Phase of PCT/JP2017/015900, filed Apr. 20, 2017, and claims priority based on Japanese Patent Application No. 2016-118837, filed Jun. 15, 2016.

TECHNICAL FIELD

The disclosure relates to a display unit and an electronic apparatus which use an organic electroluminescence (EL) element, etc. that emits light by means of an organic electroluminescence phenomenon.

BACKGROUND ART

A reflector structure has been used in a display unit (an organic EL display) that uses an organic electroluminescence element, in order to enhance a light extraction efficiency (refer to PTL 1, for example).

CITATION LIST

Patent Literature

PTL 1: Japanese Unexamined Patent Application Publication No. 2013-191533

SUMMARY OF INVENTION

It is desirable for a display unit such as an organic EL display to further enhance a light extraction efficiency.

It is desirable to provide a display unit and an electronic apparatus that have a high light extraction efficiency.

A display unit according to an embodiment of the disclosure includes a plurality of pixels and a first insulating film. The plurality of pixels are arranged in matrix in a first direction and a second direction. The first insulating film is provided between adjacent pixels of the pixels, and has first openings in light-emitting regions of the respective pixels. The first insulating film has, between pixels adjacent in the second direction of the pixels, a second opening extending in the first direction, and a remaining part inside the second opening.

An electronic apparatus according to an embodiment of the disclosure includes the display unit according to an embodiment of the disclosure.

In the display unit and the electronic apparatus according to respective embodiments of the disclosure, the first insulating film has the second opening, thus making it easier to control a shape of the first opening. In addition, the remaining part is provided inside the second opening, thus increasing a formation region of the first insulating film, making the first insulating film less likely to be detached from an underlayer.

According to the display unit and the electronic apparatus of respective embodiments of the disclosure, the second opening makes it easier to control the shape of the first opening, thus making it possible to form, in a light-emitting region, a reflector structure having a high light extraction efficiency. Further, the first insulating film is less likely to be detached from the underlayer, thus making it possible to form the first insulating film having, in addition to the first opening, the second opening that controls the shape of the first opening. Hence, it becomes possible to enhance the light extraction efficiency.

BRIEF DESCRIPTION OF DRAWINGS

FIG. 1 is a block diagram illustrating an overall configuration of a display unit according to one embodiment of the disclosure.

FIG. 2 is a cross-sectional view of a configuration of the display unit (a pixel section) illustrated in FIG. 1.

FIG. 3 is a schematic plan view of a configuration of a main part of a pixel circuit.

FIG. 4 is a schematic view of an example of pixel arrangement.

FIG. 5A is a schematic view of a planar configuration of a first insulating film illustrated in FIG. 2.

FIG. 5B is an enlarged cross-sectional view of a configuration of a vicinity of a first opening illustrated in FIG. 2.

FIG. 6A illustrates a cross-sectional configuration taken along a line B11-B12 illustrated in FIG. 5A.

FIG. 6B illustrates a cross-sectional configuration taken along a line C11-C12 illustrated in FIG. 5A.

FIG. 7A is a schematic view that describes a taper angle of the first opening of the first insulating film.

FIG. 7B is a schematic view that describes a taper angle of a recess.

FIG. 8 is a schematic cross-sectional view that describes a configuration of a first insulating film according to Comparative Example 1.

FIG. 9 is a schematic planar view that describes a configuration of a first insulating film according to Comparative Example 2.

FIG. 10 is a block diagram illustrating a configuration of an electronic apparatus according to an application example.

MODES FOR CARRYING OUT THE INVENTION

In the following, some embodiments of the disclosure are described in detail with reference to the drawings. Note that description is given in the following order.
1. Embodiment (An example in which a remaining part is provided in a second opening of a first insulating film)
2. Application Example (An example of an electronic apparatus)

Embodiment

[Configuration]

FIG. 1 is a block diagram illustrating an overall configuration of a display unit (a display unit 1) according to one embodiment of the disclosure. The display unit 1 may be, for example, an organic EL display including an organic electroluminescence element. The display unit 1 may be a top emission display unit which outputs, for example, light of any of R (red), G (green), and B (blue) from top face side.

The display unit 1 may include a pixel section 2 and a circuit section (a scanning line driver 3, a signal line driver 4, and a power line driver 5) that drives the pixel section 2. The pixel section 2 may include a plurality of pixels (pixels pr, pg, and pb) that are arranged two-dimensionally in matrix.

The pixel section 2 may display an image, by means of an active matrix scheme, for example, on the basis of an image signal inputted from an external device. There may be provided, in the pixel section 2, a plurality of scanning lines WSL each extending in a row direction of pixel arrangement, a plurality of signal lines DTL each extending in a column direction, and a plurality of power lines DSL each extending in the row direction. The scanning lines WSL, the signal lines DTL, and the power lines DSL may be electrically coupled to each of the pixels pr, pg, and pb. The pixels pr, pg, and pb may each correspond to a subpixel, for example. A set of the pixels pr, pg, and pb may configure one pixel (a pixel PX).

The pixel pr may include an organic EL element 10R that outputs red light, for example. The pixel pg may include an organic EL element 10G that outputs green light, for example. The pixel pb may include an organic EL element 10B that outputs blue light, for example. Hereinafter, the pixels pr, pg, and pb are each referred to as a "pixel P" for description in a case where no particular distinction is necessary. Further, the organic EL elements 10R, 10G, and 10B are each referred to as an "organic EL element 10" for description in a case where no particular distinction is necessary.

The scanning line WSL may supply a selection pulse to each of the pixels P. The selection pulse may be used to select, on a row basis, a plurality of pixels P arranged in the pixel section 2. The scanning line WSL may be coupled to an unillustrated output end of the scanning line driver 3 and to a gate electrode of a switching transistor WsTr described later. The signal line DTL may supply, to each of the pixels P, a signal pulse (a signal electric potential Vsig and a reference electric potential Vofs) based on the image signal. The signal line DTL may be coupled to an unillustrated output end of the signal line driver 4 and to a source electrode or a drain electrode of the switching transistor WsTr described later. The power line DSL may supply, to each of the pixels P, a fixed electric potential (Vcc) as power. The power line DSL may be coupled to an unillustrated output end of the power line driver 5 and to a source electrode or a drain electrode of a driving transistor DsTr described later. Note that the organic EL element 10 has a cathode (a second electrode 16 described later) that may be coupled to a common electric potential line (a cathode line).

The scanning line driver 3 may output a predetermined selection pulse to each of the scanning lines WSL line-sequentially to thereby cause each of the pixels P to execute each of operations such as anode reset, Vth compensation, writing of the signal electric potential Vsig, mobility compensation, and light emission operation, for example, at a predetermined timing. The signal driver 4 may generate an analog image signal corresponding to a digital image signal inputted from an external device, and may output the generated analog image signal to each of the signal lines DTL. The power line driver 5 may output a fixed electric potential to each of the power lines DSL. The scanning line driver 3, the signal line driver 4, and the power line driver 5 may be controlled to operate in conjunction with one another, on the basis of a timing control signal outputted by an unillustrated tuning controller. A digital image signal inputted from the external device may be compensated by an unillustrated image signal receiver. Thereafter, the resultant digital image signal may be inputted to the signal line driver 4.

(Configuration of Pixel Section 2)

FIG. 2 illustrates a cross-sectional configuration of the display unit 1 (the pixel section 2). FIG. 2 illustrates only a region corresponding to a portion of the organic EL elements 10R, 10G, and 10B (a portion of the organic electroluminescence element 10R and the organic electroluminescence element 10G). In the pixel section 2, a plurality of organic EL elements 10 are two-dimensionally disposed on a drive substrate 11a. A second substrate 20 may be joined onto the organic EL element 10, with a protective film 17, a sealing layer 18, and a CF/BM layer 19, for example, interposed therebetween.

The drive substrate 11a may include, on a first substrate 11 configured by glass or plastic, for example, an interlayer insulating film 122 and a pixel circuit (a pixel circuit PXLC unillustrated in FIG. 2) that drives each of the organic EL elements 10. A surface of the drive substrate 11a may be planarized by a planarizing film 123.

The pixel circuit PXLC may control light emission and light extinction in the organic EL element 10. The pixel circuit PXLC may include the organic EL element 10 (one of the organic EL elements 10R, 10G, and 10B), a storage capacitor Cs, the switching transistor WsTr, and the driving transistor DsTr, for example.

The switching transistor WsTr may control application of an image signal (a signal voltage) to a gate electrode of the driving transistor DsTr. Specifically, the switching transistor WsTr may sample a voltage (a signal voltage) of the signal line DTL in response to a voltage applied to the scanning line WSL, and may write the signal voltage into the gate electrode of the driving transistor DsTr. The driving transistor DsTr may be coupled in series to the organic EL element 10, and may control a current that flows to the organic EL element 10 in accordance with magnitude of the signal voltage sampled by the switching transistor WsTr. The driving transistor DsTr and the switching transistor WsTr may be each configured by an n-channel MOS or p-channel MOS thin film transistor (TFT), for example. The driving transistor DsTr and the switching transistor WsTr may be each a single-gate transistor or a dual-gate transistor. The storage capacitor Cs may store a predetermined voltage between the gate electrode and the source electrode of the driving transistor DsTr.

The gate electrode of the switching transistor WsTr may be coupled to the scanning line WSL. One electrode of the source electrode and the drain electrode of the switching transistor WsTr may be coupled to the signal line DTL, and the other electrode thereof may be coupled to the gate electrode of the driving transistor DsTr. One electrode of the source electrode and the drain electrode of the driving transistor DsTr may be coupled to the power line DSL, and the other electrode thereof may be coupled to an anode (a first electrode 13 described later) of the organic EL element 10. The storage capacitor Cs may be provided between the gate electrode of the driving transistor DsTr and an electrode on side of the organic EL element 10.

FIG. 3 illustrates an example of a wiring layout of a main part of the pixel circuit PXLC as described above. The pixel circuit PXLC may be configured by utilizing, for example, a plurality of wiring layers (a first metal layer M1 and a second metal layer M2), a semiconductor layer S1, and interlayer contacts (contact holes c11 to c13) between the first metal layer M1 and the second metal layer M2.

As illustrated in FIG. 3 as an example, a gate electrode 125g1 of the switching transistor WsTr, a gate electrode 125g2 of the driving transistor DsTr, a lower electrode 126a of the storage capacitor Cs, and the signal line DTL may be disposed in the first metal layer M1. Source-drain electrodes (125sd1 and 125sd2) of the switching transistor WsTr, source-drain electrodes (125sd3 and 125sd4) of the driving transistor DsTr, an upper electrode 126b of the storage capacitor Cs, the scanning line WSL, and the power line DSL may be disposed in the second metal layer M2. Among those described above, the gate electrode 125g1 of the switching transistor WsTr and the scanning line WSL may be subjected to interlayer coupling through the contact hole c11. The source-drain electrode 125sd1 of the switching transistor WsTr may be subjected to interlayer coupling to the signal line DTL through the contact hole c12. The source-drain electrode 125sd2 of the switching transistor WsTr may be subjected to interlayer coupling to the lower electrode 126a of the storage capacitor Cs and to the gate electrode 125g2 of the driving transistor DsTr through the contact hole c13. The upper electrode 126b of the storage capacitor Cs may be coupled to the anode (the first electrode 13 unillustrated in FIG. 13) of the organic EL element 10 through a contact part C1 (anode contact).

Note that, in this example, a circuit configuration of 2Tr1C is exemplified as the pixel circuit PXLC; however, the configuration of the pixel circuit PXLC is not limited thereto. The pixel circuit PXLC may have a circuit configuration in which components such as various capacitors and transistors are further added to such a 2Tr1C circuit.

The organic EL elements 10R, 10G, and 10B may be provided in a regular arrangement on the drive substrate 11a as described above. FIG. 4 illustrates an example of pixel arrangement (arrangement of the organic EL elements 10). The pixels pr, pg, and pb may be arranged in matrix in a first direction d1 and a second direction d2. The first direction d1 and the second direction d2 may be orthogonal to each other, for example. In a case of using a wet process such as printing, for example, in a film-forming process of the organic EL element 10, it is desirable that a plurality of pixels pr, pg, and pb be arranged along one direction for each of light emission colors. For example, the pixels pr (organic EL elements 10R) may be arranged in one line along the first direction d1; the pixels pg (organic EL elements 10G) may be arranged in one line along the first direction d1; and the pixels pb (organic EL elements 10B) may be arranged in one line along the first direction d1. The pixels pr, pg, and pb may be arranged to be adjacent to one another in the second direction d2. The pixels pr, pg, and pb may each have, but not particularly limited to, a rectangular surface shape, for example. The first direction d1 is along a longitudinal direction of each (rectangular) surface shape of the pixels pr, pg, and pb. In a manufacturing process, for example, ink of each of the light emission colors may be dropped for each of the lines along the first direction d1, thus allowing for formation of organic layers 15R, 15G, and 15B.

The organic EL element 10R may include, between the first electrode 13 and the second electrode 16, the organic layer 15R that includes a red light-emitting layer. Likewise, the organic EL element 10G may include, between the first electrode 13 and the second electrode 16, the organic layer 15G that includes a green light-emitting layer (FIG. 2). The organic EL element 10B may include, between the first electrode 13 and the second electrode 16, the organic layer 15B that includes a blue light-emitting layer (FIG. 2).

The first electrode 13 may serve as an anode, for example, and may be provided for each of the pixels P. Examples of a constituent material of the first electrode 13 may include a simple substance and an alloy of a metal element such as aluminum (Al), chromium (Cr), gold (Au), platinum (Pt), nickel (Ni), copper (Cu), tungsten (W), and silver (Ag). Further, the first electrode 13 may include a stacked film of a metal film and an electrically conductive material having light-transmissivity (a transparent electrically conductive film). The metal film may be made of a simple substance or an alloy of the above-mentioned metal elements. Examples of the transparent electrically conductive film may include indium-tin oxide (ITO), indium-zinc oxide (IZO), tungsten oxide ($WO_x$), and a zinc oxide (ZnO)-based material. Examples of the zinc oxide-based material may include aluminum (Al)-doped zinc oxide (AZO) and gallium (Ga)-doped zinc oxide (GZO).

The organic layers 15R, 15G, and 15B may each generate recombination of electrons and holes through application of an electric field, and may include an organic electroluminescent layer (the red light-emitting layer, the green light-emitting layer, or the blue light-emitting layer) that emits a color beam of one of R, G, and B. Examples of a film-forming method of these organic layers 15R, 15G, and 15B may include wet processes such as a printing method and a coating method. Examples thereof may include an ink-jet printing method and a nozzle coating method. The organic layers 15R, 15G, and 15B may each include, in addition to the organic electroluminescent layer, for example, a hole injection layer, a hole transport layer, and an electron transport layer, as necessary. Further, an electron injection layer may be formed between each of the organic layers 15R, 15G, and 15B and the second electrode 16.

The second electrode 16 may serve as a cathode, for example, and may be formed across the entire surface of the pixel section 2 (i.e., as an electrode common to all of the pixels). The second electrode 16 may be configured by a transparent electrically conductive film, for example. As a material of the transparent electrically conductive film, an oxide material similar to those listed as the material of the above-described first electrode 13 may be used. Although a thickness of the second electrode 16 is not particularly limited, the thickness may be preferably set in consideration of electrical conductivity and light-transmissivity. In addition to these materials, an alloy of magnesium and silver (an Mg—Ag alloy) may also be used for the second electrode 16.

The organic layers 15R, 15G, and 15B of the respective organic EL elements 10R, 10G, and 10B may be each formed in a region (a first opening H1a) defined by a pixel separation film 14. The pixel separation film 14 may be formed on the first electrode 13, and may have the first opening H1a that faces the first electrode 13.

As described above, the first opening H1a of the pixel separation film 14 may define a light-emitting region of each of the pixels P into a desired shape, and may serve to separate organic layers in adjacent pixel columns (i.e., organic layers of different light emission colors) from each other. Further, the pixel separation film 14 may ensure insulation between the first electrode 13 and the second electrode 16. The pixel separation film 14 may include a first insulating film 14A, and a second insulating film 14B stacked in a predetermined region on the first insulating film 14A. In this example, in addition to the first opening H1a, a second opening H1b that controls a shape of the first opening H1a may be provided in the first insulating film 14A.

FIG. 5A illustrates a planar configuration (i.e., a configuration of a surface parallel to a surface of the substrate) of the first insulating film 14A. Note that FIG. 5A illustrates, for the sake of simplicity, a configuration in which three pixels pr, three pixels pg, and three pixels pb are each arranged in the first direction d1, and in which a set of the pixels pr, pg, and pb is arranged in the second direction d2. FIG. 5B is an enlarged view of a vicinity of the opening of the first insulating film 14A in the cross-sectional configuration of FIG. 2. Note that the configuration illustrated in FIG. 2 corresponds to a cross-sectional configuration taken along a line A11-A12 in FIG. 5.

In this manner, the first insulating film 14A may have, for example, two first openings H1a for each of the pixels P (for each first electrode 13). Alternatively, one first opening H1a or three or more first openings H1a may be adopted. In the display unit 1, the first opening H1a may be provided with a reflector (reflective structure). The first opening H1a may have a rectangular shape, for example, and may be disposed to have a long side in the first direction d1.

The second opening H1b may be provided between the pixels P adjacent to each other in the second direction d2 (e.g., between the pixels pr and pg, between the pixels pg and pb, and between the pixels pb and pr). The second opening H1b may have a linear shape extending along the first direction d1. For example, a plurality of second openings H1b may be provided substantially parallel to one another to have a stripe shape. The second opening H1b may be provided, for example, in a region where no first electrode 13 is formed. The second opening H1b may be provided to straddle from above the first electrode 13 to the region where no first electrode 13 is formed. In order to accurately control the shape of the first opening H1a, the second opening H1b and the first opening H1a may be preferably provided at the same pitch. Specifically, a distance between two first openings H1a and a distance between the first opening H1a and the second opening H1b may be equal to each other.

The first insulating film 14A may include, for example, a photosensitive resin such as an acrylic resin, a polyimide resin, a fluorine resin, a silicon resin, a fluorine polymer, a silicon polymer, a novolak resin, an epoxy resin, and a norbornene resin. Alternatively, any of these resin materials with a colorant dispersed therein may also be used. In addition to such organic materials, for example, an inorganic material such as silicon oxide ($SiO_2$), silicon nitride (SiN), and silicon oxynitride (SiON) may also be used for the first insulating film 14A. It is desirable that the first insulating film 14A have lyophilicity (i.e., affinity to ink upon formation of the organic layers 15R, 15G, and 15B). One reason for this is that a wet-spreading property of ink becomes favorable in the organic layers 15R, 15G, and 15B during film-formation, thus making uneven film thickness less likely to occur. The first insulating film 14A may have a thickness of 0.1 μm to 10 μm, for example.

A refractive index of the first insulating film 14A may be set, for example, smaller than a refractive index of each of the protective film 17 and the sealing layer 18 described later. The first insulating film 14A may have a thickness of 1 μm to 10 μm, for example. By properly setting factors such as the thickness and the refractive index of the first insulating film 14A and shapes of the first opening H1a (such as a shape and an inclination angle θ of an inclined surface PS described later), it becomes possible to cause the first opening H1a to serve as the so-called reflector (reflective structure).

The organic layer 15R (or the organic layer 15G or 15B; the same hereinafter) may be formed inside the two first openings H1a to cover their bottoms. During display-driving, as illustrated in FIG. 5B, light outputted from the organic layer 15R (light-emitting layer) includes, in addition to light traveling in a frontal direction L1, light traveling in a direction L2 shifted from the frontal direction L1 (i.e., light traveling in an oblique direction). The light traveling in the oblique direction L2 is reflected at the inclined surface PS of the first opening H1a, and is raised in the frontal direction L1. The reflector included in the opening H1 makes it possible to enhance a light extraction efficiency.

For example, each parameter may be preferably set as follows. In a case where θ(°) denotes an inclination angle of the inclined surface PS relative to a planar direction of the first electrode 13; n1 denotes a refractive index of a constituent material of the first insulating film 14A; n2 denotes a refractive index of a constituent material of the sealing layer 18; and n1<n2 holds true, it is preferable that the inclination angle θ satisfy the following expression (1), and it is more preferable that the inclination angle θ satisfy the following expression (2).

$$75.2-54(n2-n1) \le \theta \le 81.0-20(n2-n1) \tag{1}$$

$$76.3-46(n2-n1) \le \theta \le 77.0-20(n2-n1) \tag{2}$$

Further, it is preferable that the refractive index n1 and the refractive index n2 satisfy expressions: $1.1 \le n2 \le 1.8$ and $n2-n1 \ge 0.20$. Examples of a material that satisfies the expressions may include an acrylic resin material for the first insulating film 14A and an epoxy resin material for the sealing layer 18.

The second insulating film 14B may be provided in a region between the pixels P adjacent in the second direction d2 on the first insulating film 14A (i.e., in a region between the first openings H1a disposed in different pixel columns) to extend in the first direction d1. The second insulating film 14B may be provided to cover the second opening H1b of the first insulating film 14A (FIG. 2). For the second insulating film 14B, a material either the same as or different from that of the first insulating film 14A may be used. However, it is desirable that at least an upper surface of the second insulating film 14B have a liquid-repellent property. The second insulating film 14B may contain a liquid-repellent component such as fluorine. Alternatively, a liquid-repellent treatment may be applied after film-formation of the second insulating film 14B. One reason for this is that it is possible to suppress the wet-spreading (color mixing) of ink between adjacent pixel columns (i.e., between organic layers of different light emission colors) and thus to enhance a function as a partition wall. The second insulating film 14B may have a thickness of 0.5 μm to 10 μm, for example. A width W1 of the second insulating film 14B in the second direction d2 may be preferably larger than a width W2 of the second opening H1b of the first insulating film 14A in the second direction d2. This makes it possible to prevent the second insulating film 14B from falling into the second opening H1b even in a case where positional deviation occurs between the first insulating film 14A and the second insulating film 14B during manufacturing. Accordingly, in a case where the organic layer (the organic layer 15R, 15G, or 15B) is formed by means of a wet process, ink pinning may be stabilized, allowing for uniform thickness of the organic layer in the light-emitting region. In other words, it is possible to enhance luminance. Further, when the W1 of the second insulating film 14B in the second direction d2 is larger than the width W2 of the second opening H1b of the first insulating film 14A in the second direction d2, ends of the first electrode 13 may be covered with the second insulating film 14B, even in a case where the second opening H1b is provided to straddle over the first electrode 13.

In the present embodiment, such a first insulating film 14A of the pixel separation film 14 includes a remaining part 14AI inside the second opening H1b. This makes it possible to increase a formation region of the first insulating film 14A, and thus to prevent detachment of the first insulating film 14A even in a case where the second opening H1b is formed, although the detail is described later.

FIG. 6A illustrates a cross-sectional configuration taken along a line B11-B12 illustrated in FIG. 5A (a cross-sectional configuration of a region between adjacent pixels Pr). As illustrated in FIG. 5A, the remaining part 14AI may be provided at a position deviated from a region between the first openings H1a adjacent to each other in the second direction d2. As described above, the second opening H1b may control the shape of the first opening H1a. Accordingly, it is preferable that the remaining part 14AI be formed to avoid a position adjacent to the first opening H1a. FIG. 5A illustrates the case where two remaining parts 14AI are provided for one second opening H1b. However, it is sufficient that one remaining part 14AI may be provided for one second opening H1b. Alternatively, three or more remaining parts 14AI may be provided. The remaining part 14AI may have a rectangular planar shape, for example.

As illustrated in FIG. 6A, the remaining part 14AI may be a part where a portion of the first insulating film 14A remains inside the second opening H1b. For example, the remaining part 14AI may be provided continuously with the first insulating film 14A at both sides of the second opening H1b in the second direction d2. The remaining part 14AI may have a thickness t2 of 0.1 µm to 10 µm, for example. The thickness t2 of the remaining part 14AI may be equal to a thickness of the first insulating film 14A other than the remaining part 14AI, but may be preferably smaller than the thickness of the first insulating film 14A. A width b2 of the remaining part 14AI in the second direction d2 may be equal to a width W2 of the second opening H1b, for example. The second insulating film 14B may be provided on the remaining part 14AI. A width W1 of the second insulating film 14B in the second direction d2 may be preferably larger than the width b2 of the remaining part 14AI in the second direction d2. This makes it possible to prevent the second insulating film 14B from falling into the remaining part 14AI even in a case where positional deviation occurs between the first insulating film 14A and the second insulating film 14B during manufacturing. Accordingly, it is possible to enhance luminance similarly to those described above, in a case where the organic layer is formed by means of a wet process. It is preferable to adjust the thickness of the second insulating film 14B to be sufficiently larger than the thickness t2 of the remaining part 14AI, in order to cause the second insulating film 14B to exhibit a liquid-repellent property.

As illustrated in FIG. 5A, the first insulating film 14A may be provided with a recess-forming region H2a (a recess H2), for example, at a position adjacent to the remaining part 14AI in the second direction d2.

FIG. 6B illustrates a cross-sectional configuration taken along a line C11-C12 in FIG. 5A. As illustrated in FIG. 5A, each region between pixels pr (or between pixels pg or between pixels pb) adjacent in the first direction d1 may have the recess H2 (i.e., may be a recess-forming region H2a). The recess H2 may connect together the first openings H1a of the pixels P adjacent to each other in the first direction d1. In other words, the recess H2 may connect together the first openings H1a of the pixels P of the same light emission colors out of the plurality of pixels P.

The recess H2 may couple together the openings H1 of the pixels P of the same light emission color (the pixels pr, the pixels pg, or the pixels pb), and may serve as an ink channel of the organic layer (the organic layer 15R, the organic layer 15G, or the organic layer 15B). Note that, although illustration is omitted in FIG. 5A, the first openings H1a may be connected together through the recess H2 between adjacent pixels pr. The two first openings H1a either may be connected together or may not be connected together in the recess H2. Factors such as a shape, a width b1, and a depth f1 of the recess H2 are not particularly limited. For example, a length of the recess H2 in the first direction d1 may be substantially equal to a length of the remaining part 14AI in the first direction d1. As illustrated in FIGS. 6A and 6B, it is desirable that the first insulating film 14A have a thickness (t1) in a bottom of the recess H2, and the thickness t1 may be in a range from 0.1 µm to 2 µm, for example. In other words, it is desirable that ends of the first electrode 13 be configured to be covered with the first insulating film 14A. One reason for this is that it is possible to suppress occurrence of electrical short circuit between the first electrode 13 and the second electrode 16. Further, it is desirable that the thickness t1 of the first insulating film 14A of the recess H2 be formed sufficiently smaller than the depth f1. In this example, the organic layer 15R may also be formed inside the recess H2 to cover a surface of the bottom. One reason for this is that the organic layer 15R may be formed by wet-spreading up to an adjacent first opening H1a through the recess H2 during the film-formation. However, the bottom surface of the recess H2 may not be necessarily covered with the organic layer 15R. Only a selective region of the bottom surface of the recess H2 may be covered with the organic layer 15R.

It is desirable that a contact angle on a surface (side surface) of the recess H2 be smaller than a contact angle on the upper surface of the second insulating film 14B. Further, as schematically illustrated in FIGS. 7A and 7B, it is desirable that an inclination angle θ2 of the side surface of the recess H2 be smaller than an inclination angle θ of a side surface of the first opening H1a of the first insulating film 14A (θ>θ2). One reason for this is that pinning is relaxed to make ink more likely to undergo wet-spreading more uniformly. In a case where the first opening H1a and the recess H2 are formed by means of halftone exposure described later, the inclination angles θ and θ2 may have a relation as described above.

Note that FIG. 6B illustrates a TFT 12 in the drive substrate 11a. The TFT 12 corresponds to the driving transistor DsTr illustrated in FIGS. 1 and 3, for example. The TFT 12 may include a semiconductor layer 124 (a portion of the semiconductor layer S1 illustrated in FIG. 3) in a selective region on the first substrate 11, for example, and may include a gate electrode 125g2 on the semiconductor layer 124 with a gate insulating film 121 interposed therebetween. An interlayer insulating film 122 may be formed on the gate electrode 125g2. The source-drain electrodes 125sd3 and 125sd4 may be provided on the interlayer insulating film 122. The source-drain electrodes 125sd3 and 125sd4 may be electrically coupled to the semiconductor layer 124 through, respectively, contact holes c21 and c22 provided in the interlayer insulating film 122. The source-drain electrode 125sd4 may be electrically coupled to the first electrode 13 through the contact part C1.

The first insulating film 14A as described above may be formed, for example, as follows. That is, a plurality of first electrodes 13 may be first formed on the drive substrate 11a. Thereafter, the first insulating film 14A made of the above-described photosensitive resin, etc. may be formed, for example, by means of a method such as coating in a predetermined thickness to cover the plurality of first electrodes 13. Thereafter, a photo mask may be used to perform exposure, followed by going through processes such as development, washing, and drying, thereby forming the first opening H1a, the second opening H1b, the remaining part 14AI, and the recess H2. At this occasion, the first insulating film 14A may be exposed using a halftone mask, for example, to allow a formation region of the first opening H1a and the second opening H1b and a formation region of the remaining part 14AI and the recess-forming region H2a to have different exposure amounts. This makes it possible to form the openings (the first opening H1a and the second opening H1b) and regions having smaller thicknesses (the remaining part 14AI and the recess H2), using one photo mask. Alternatively, a photo mask for formation of the first opening H1a and the second opening H1b and a photo mask for formation of the remaining part 14AI and the recess H2 may be each provided to perform exposure in different processes.

Note that, in a case of using, for example, an inorganic material such as a silicon oxide film as the first insulating film 14A, it is possible to form the first opening H1a, the second opening H1b, the remaining part 14AI, and the recess H2 by performing etching using a photolithography method, for example, after formation of the first insulating film 14A by means of a CVD method, for example.

Thereafter, the second insulating film 14B may be patterned in a predetermined region on the first insulating film 14A. This makes it possible to form the pixel separation film 14 having the above-described configuration. After the formation of the pixel separation film 14, the organic layers 15R, 15G, and 15B may be formed in the respective openings H1, for example, by means of the wet process such as the ink-jet printing method.

The protective film 17 may be configured either by an insulating material or an electrically conductive material. Examples of the insulating material may include inorganic amorphous insulating materials such as amorphous silicon ($\alpha$-Si), amorphous silicon carbide ($\alpha$-SiC), amorphous silicon nitride ($\alpha$-Si$_{1-x}$N$_x$), and amorphous carbon ($\alpha$-C). Such an inorganic amorphous insulating material does not configure grain, and thus has low water permeability, allowing the material to serve as a favorable protective film. In addition to those described above, silicon nitride, silicon oxide, and silicon oxynitride may also be used.

The sealing layer 18 may be formed substantially uniformly on the protective film 17, and may serve as an adhesive layer, for example. Examples of a material of the sealing layer 18 may include an acrylic resin, a polyimide resin, a fluorine resin, a silicon resin, a fluorine polymer, a silicon polymer, an epoxy resin, and a norbornene resin.

A refractive index of the material of each of the protective film 17 and the sealing layer 18 may have influence on a light extraction efficiency of the reflective structure, and thus a proper material may be preferably selected in consideration of sealing performance and the light extraction efficiency.

The CF/BM layer 19 may be a layer that includes color filter layers (a red filter 19R, a green filter 19G, and a blue filter 19B) and a black matrix layer BM. The red filter 19R, the green filter 19G, and the blue filter 19B may be each disposed in a region facing the opening H1. These red filter 19R, green filter 19G, and blue filter 19B may be each configured by a resin with a pigment mixed therein. The black matrix layer BM may be configured, for example, by a resin film with a black colorant mixed therein, or by a thin film filter utilizing interference of a thin film. The thin film filter may have a configuration in which, for example, one or more thin films made of a material such as metal, a metal nitride, and a metal oxide are stacked to attenuate light by utilizing the interference of the thin films. Specific examples of the thin film filter may include a filter in which chromium (Cr) and chromium(III) oxide ($Cr_2O_3$) are stacked alternately. Such a CF/BM layer 19 may be disposed as necessary (may not be necessarily disposed). The provision of the CF/BM layer 19, however, makes it possible to extract light generated in the organic EL element 10 and to absorb other stray light as well as external light, and thus to improve a contrast.

The second substrate 20, together with the sealing layer 18, may seal the organic EL element 10. The second substrate 20 may be configured, for example, by a material such as glass or plastic that is transparent to the light generated in the organic EL element 10.

[Workings and Effects]

In the display unit 1 as described above, a selection pulse may be supplied to the switching transistor WsTr of each of the pixels P from the scanning line driver 3 to select a pixel P. A signal voltage corresponding to an image signal supplied from the signal line driver 4 may be supplied to the selected pixel P, and the supplied signal voltage may be stored in the storage capacitor Cs. The driving transistor DsTr may be subjected to ON/OFF control in response to the signal stored by the storage capacitor Cs, and a drive current may be flowed into the organic EL element 10. This allows for generation of light emission through recombination of holes and electrons in the organic EL element 10 (the organic electroluminescent layer). The light may be extracted by transmission through the second electrode 16, the protective film 17, the sealing layer 18, the CF/BM layer 19, and the second substrate 20, for example. Additive color mixture of the color beams thus outputted from each of the pixels P (the pixels pr, pg, and pb) allows color image display to be performed.

Here, in the present example, the first insulating film 14A has the second opening H1b and the remaining part 14AI inside the second opening H1b. In such a display unit 1, the remaining part 14AI makes it possible to prevent the detachment of the first insulating film 14A, and the second opening H1b makes it possible to enhance the light extraction efficiency. This is described below in detail with reference to comparative examples.

FIG. 8 illustrates a cross-sectional configuration of a first insulating film 104 according to a comparative example. The first insulating film 104 has no second opening (e.g., the second opening H1b in FIG. 2), and has only the first opening H1a. In a case of forming the first opening H1a in such a first insulating film 104 using a photolithography technique, there is a possibility that the shape of the first opening H1a may be changed (changed from the configuration in FIG. 8(A) to that in FIG. 8(B)) due to a firing process after the development. One reason for this is that a photoresist having been softened in the firing process is deformed under the influence of surface tension, and is cured as it is. The deformation due to the surface tension becomes larger, as the photo resist has a larger area. That is, in a case where a plurality of first openings H1a are formed on a substrate 111, a shape of the outermost first opening H1a is more likely to be influenced. When the shape of the first opening H1a is disturbed, the performance of the first opening H1a as the reflector is also lowered, thus the light extraction efficiency is lowered. Further, there occurs unevenness in luminance for each of the first openings H1a.

In contrast, in the display unit 1, the first insulating film 14A may be provided with the second opening H1b between the pixels P adjacent to each other, in addition to the first opening H1a that serves as the light-emitting region of the pixel P. Thus, the influence of the surface tension is relaxed by the second opening H1b. Hence, it is possible to enhance the light extraction efficiency by accurately controlling the shape of the first opening H1a. Further, it is also possible to suppress the unevenness in luminance for each of the first openings.

Meanwhile, in a case where no remaining part (e.g., the remaining part 14AI in FIG. 5A) is formed inside the second opening H1b as in a first insulating film (a first insulating film 104A) illustrated in FIG. 9, a formation region of the first insulating film 104A becomes very small, and thus an area of adhesion with respect to side of an underlayer (e.g., the first substrate 11) is decreased, thus making the first insulating film 104A more likely to be detached during the developing. It may be conceivable to form a region having a reduced thickness of the first insulating film 104A, instead of the second opening H1b. In this case, however, it is not possible to sufficiently perform the above-described control of the shape of the first opening H1a.

Accordingly, in the present embodiment, the provision of the remaining part 14AI inside the second opening H1b increases the formation region of the first insulating film 14A, thus making it possible to increase adhesiveness with respect to the underlayer. Hence, even the first insulating film 14A having the second opening H1b in addition to the first opening H1a is less likely to be detached from the underlayer, thus making it possible to enhance the light extraction efficiency.

As described above, in the display unit 1 according to the present embodiment, the second opening H1b makes it easier to accurately control the shape of the first opening H1a, thus making it possible to form, in the light-emitting region, the reflector structure having a high light extraction efficiency. Further, the first insulating film 14A is less likely to be detached from the underlayer, thus allowing for formation of the first insulating film 14A having the first opening H1a and the second opening H1b. Hence, it becomes possible to enhance the light extraction efficiency.

Moreover, in the display unit 1, the first insulating film 14A may be provided with the recess H2 that connects together the openings H1 of the pixels of the same light emission color out of the plurality of pixels P. Specifically, the recess H2 may be formed in each of a region between the openings H1 of adjacent pixels pr, a region between the openings H1 of adjacent pixels pg, and a region between the openings H1 of adjacent pixels pb. This allows for the wet-spreading of ink, through respective recesses H2, to a pixel pr1 from its adjacent pixel pr, to a pixel pg1 from its adjacent pixel pg, and to a pixel pb1 from its adjacent pixel pb, even in a case where a partial pixel row X1 (the pixels pr1, pg1, and pb1) has a part where ink is not sufficiently dropped or a part where no dropping is performed upon forming the organic layers 15R, 15G, and 15B by means of a wet process, for example. This allows for formation of the organic layers 15R, 15G, and 15B each in uniform film thickness in each of the pixel columns of the pixels pr, pg, and pb. Hence, it is possible to reduce uneven film thickness of the organic layers 15R, 15G, and 15B caused by a film-forming process.

The effects brought by the recess H2 are particularly effective in a case where the first opening H1a has the reflector (reflective structure). In the case where the first opening H1a has the reflector, the first insulating film 14A may be designed to allow the material and the thickness of the first insulating film 14A and the shape of the first opening H1a, for example, to satisfy various conditions. In this case, the first insulating film 14A may be designed to have a larger thickness than a case where no reflector is formed. Accordingly, the wet-spreading of ink is poor between the pixels of the same light emission color. Thus, the part where ink is not sufficiently dropped or the part where no dropping is performed, that has been generated during the printing process as described above, may remain as it is, thus causing unevenness in luminance in some cases. Connecting the openings H1 together using the recess H2 as in the display unit 1 makes it possible to perform film-formation without inhibiting the wet-spreading of ink even in a case where the first insulating film 14A is designed to have a relatively large film thickness. In other words, it is possible to reduce unevenness in luminance caused by the wet process while enhancing a light extraction efficiency of the organic EL element 10, thus allowing for achievement of a display having higher image quality.

Application Example

The display unit 1 described in the foregoing embodiment may be applied to various types of electronic apparatuses. FIG. 10 illustrates a functional block configuration of an electronic apparatus (an electric apparatus 1A) to which the display unit 1 is applied. Non-limiting examples of the electronic apparatus 1A may include a television, a personal computer (PC), a smartphone, a tablet PC, a mobile phone, a digital still camera, and a digital video camera.

The electronic apparatus 1A may include, for example, the above-described display unit 1 and an interface section 30. The interface section 30 may be an input section that receives various signals and a power supply, for example, from an external device. The interface section 30 may include a user interface such as a touch panel, a keyboard, and operation buttons, for example.

Although the description has been given hereinabove with reference to the embodiment and the application example, the disclosure is not limited thereto, but may be modified in a wide variety of ways. For example, the foregoing embodiment, etc. has exemplified the case where the pixel separation film 14 may be configured by a stacked structure of the first insulating film 14A and the second insulating film 14B, and where these first insulating film 14A and second insulating film 14B may be formed in different processes. However, the configuration of the pixel separation film 14 is not limited thereto. For example, the second insulating film 14B may not necessarily be provided insofar as a region between pixel columns (i.e., between pixels of different light emission colors) allows for sufficient separation.

Further, the first insulating film 14A and the second insulating film 14B may be formed integrally (as a single-layer film). In other words, the first insulating film 14A may include a part that corresponds to the second insulating film 14B (i.e., the first insulating film 14A may include a structure that serves also as the second insulating film 14B).

Furthermore, in the foregoing embodiment, etc., the first opening H1a formed in the first insulating film 14A may have a rectangular shape. However, the shape of the first opening H1a is not limited to the rectangular shape. In addition to the rectangular shape, various shapes such as a circular shape, an elliptical shape, and a polygonal shape may also be adopted. In a case where a plurality of first openings H1a are provided, the plurality of first openings H1a may be either the same as or different from one another in their shapes. Layouts, such as shape, position, and number, of the first opening H1a, the second opening H1b, the recess H2, and the remaining part 14AI are not particularly limited, but may be modified appropriately within a range where the above-described effects may be exerted.

In addition, factors such as a material and a thickness of each layer, and a film-forming method as well as a film-forming condition exemplified in the foregoing embodiment, etc. are not limitative. Any other material, any other thickness, any other film-forming method, and any other film-forming condition may be adopted besides those described above.

Further, in the foregoing embodiment, etc., description has been given with reference to the specific configuration of the organic EL element 10; however, it is not necessary to provide all the layers, and any other layer may be further provided.

Furthermore, in the foregoing embodiment, etc., description has been given of the case of the active matrix display unit; however, the disclosure may also be applied to a passive matrix display unit. Moreover, the configuration of the pixel circuit PXLC for active matrix driving is not limited to that described in the foregoing embodiment; a capacitor element or a transistor may also be added as necessary. In this case, a necessary drive circuit may also be added, in addition to the scanning line driver 3, the signal line driver 4, and the power line driver 5, depending on alteration of the pixel circuit PXLC.

Note that the effects described herein are mere examples. The effect of the disclosure is not limited thereto, and may include other effects.

Moreover, the disclosure may also have the following configurations.

(1)
A display unit including:
a plurality of pixels that are arranged in matrix in a first direction and a second direction; and
a first insulating film provided between adjacent pixels of the pixels, and having first openings in light-emitting regions of the respective pixels, the first insulating film having, between pixels adjacent in the second direction of the pixels, a second opening extending in the first direction, and a remaining part inside the second opening.

(2)
The display unit according to (1), in which a plurality of the second openings are provided in a stripe shape.

(3)
The display unit according to (1) or (2), in which the remaining part has a thickness that is equal to or smaller than a thickness of the first insulating film other than the remaining part.

(4)
The display unit according to any one of (1) to (3), in which the remaining part is provided at a position deviated from a region between the first openings that are adjacent to each other in the second direction.

(5)
The display unit according to any one of (1) to (3), further including a second insulating film that is provided on the first insulating film and extends in the first direction.

(6)
The display unit according to (5), in which the second insulating film has a liquid-repellent property.

(7)
The display unit according to (5) or (6), in which a width of the second insulating film in the second direction is larger than a width of the remaining part in the second direction.

(8)
The display unit according to any one of (5) to (7), in which a width of the second insulating film in the second direction is larger than a width of the second opening in the second direction.

(9)
The display unit according to any one of (1) to (8), in which
the pixels each include an organic electroluminescence element that emits light of one of a plurality of colors, and
the pixels are arranged along the first direction for each of light emission colors.

(10)
The display unit according to any one of (1) to (9), in which the first insulating film has a recess that connects together the first openings of the respective pixels that are adjacent to each other in the first direction.

(11)
The display unit according to any one of (1) to (10), in which each of the first openings is provided with a reflector.

(12)
The display unit according to any one of (1) to (11), in which the first insulating film is provided continuously from both sides of the second opening in the second direction in the remaining part.

(13)
An electronic apparatus including a display unit,
the display unit including
a plurality of pixels that are arranged in matrix in a first direction and a second direction, and
a first insulating film provided between adjacent pixels of the pixels, and having first openings in light-emitting regions of the respective pixels, the first insulating film having, between pixels adjacent in the second direction of the pixels, a second opening extending in the first direction, and a remaining part inside the second opening.

This application claims the benefit of Japanese Priority Patent Application JP2016-118837 filed with the Japan Patent Office on Jun. 15, 2016, the entire contents of which are incorporated herein by reference.

It should be understood by those skilled in the art that various modifications, combinations, sub-combinations, and alterations may occur in accordance with design requirements and other factors insofar as they are within the scope of the appended claims or the equivalents thereof.

The invention claimed is:
1. A display unit comprising:
a plurality of pixels that are arranged in matrix in a first direction and a second direction; and
a first insulating film provided between adjacent pixels of the pixels, and having first openings in light-emitting regions of the respective pixels, the first insulating film having, between pixels adjacent in the second direction of the pixels, a second opening extending in the first direction, a remaining part inside the second opening, and a dimension of the remaining part in the first direction is less than a dimension of the second opening in the first direction.

2. The display unit according to claim 1, wherein the second opening is part of a plurality of the second openings, and each of the plurality of second openings is provided in a stripe shape.

3. The display unit according to claim 1, wherein the remaining part has a thickness that is equal to or smaller than a thickness of the first insulating film other than the remaining part.

4. The display unit according to claim 1, wherein the remaining part is provided at a position deviated from a region between the first openings that are adjacent to each other in the second direction.

5. The display unit according to claim 1, wherein
the pixels each include an organic electroluminescence element that emits light of one of a plurality of colors, and
the pixels are arranged along the first direction for each of light emission colors.

6. The display unit according to claim 1, wherein the first insulating film has a recess that connects together the first openings of the respective pixels that are adjacent to each other in the first direction.

7. The display unit according to claim 1, wherein each of the first openings is provided with a reflector.

8. The display unit according to claim 1, wherein the first insulating film is provided continuously from both sides of the second opening in the second direction in the remaining part.

9. An electronic apparatus comprising a display unit, the display unit including
a plurality of pixels that are arranged in matrix in a first direction and a second direction, and
a first insulating film provided between adjacent pixels of the pixels, and having first openings in light-emitting regions of the respective pixels, the first insulating film having, between pixels adjacent in the second direction of the pixels, a second opening extending in the first direction, a remaining part inside the second opening, the remaining part extends across an entirety of the second opening in the second direction, and the remaining part extends across less than an entirety of the second opening in the first direction.

* * * * *